(12) United States Patent
Ueda et al.

(10) Patent No.: US 8,053,073 B2
(45) Date of Patent: Nov. 8, 2011

(54) PROCESS FOR PRODUCING RESIN-COATED METAL PARTICLES, RESIN-COATED METAL PARTICLES, AND TONER FOR FORMING CIRCUIT

(75) Inventors: Kiyoko Ueda, Hakusan (JP); Ichiro Nakamura, Kusatsu (JP); Kiyoyasu Sakurada, Moriyama (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 1132 days.

(21) Appl. No.: 10/575,662

(22) PCT Filed: Sep. 15, 2004

(86) PCT No.: PCT/JP2004/013444
§ 371 (c)(1),
(2), (4) Date: Apr. 14, 2006

(87) PCT Pub. No.: WO2005/035605
PCT Pub. Date: Apr. 21, 2005

(65) Prior Publication Data
US 2008/0081275 A1    Apr. 3, 2008

(30) Foreign Application Priority Data
Oct. 14, 2003   (JP) .................................. 2003-354099

(51) Int. Cl.
*G03G 5/00*   (2006.01)
(52) U.S. Cl. .................... 428/357; 428/402; 430/111.35; 430/137.12
(58) Field of Classification Search ............. 430/111.35, 430/108.6; 428/214, 216, 219, 220, 357, 428/402
See application file for complete search history.

(56) References Cited

U.S. PATENT DOCUMENTS

| | | | |
|---|---|---|---|
| 5,853,938 A * | 12/1998 | Nakazawa et al. | 430/108.6 |
| 6,548,168 B1 * | 4/2003 | Mulvaney et al. | 428/402 |
| 2001/0051311 A1 * | 12/2001 | Hakata | 430/111.3 |
| 2002/0191983 A1 * | 12/2002 | Mizuno et al. | 399/130 |

FOREIGN PATENT DOCUMENTS

| | | |
|---|---|---|
| CN | 1225047 A | 8/1999 |
| EP | 0 949 027 A1 | 10/1999 |
| JP | 63-005019 | 1/1988 |
| JP | 09-204065 | 8/1997 |
| JP | 2003-086926 | 3/2003 |
| JP | 2003-168324 | 6/2003 |
| WO | WO-98/51435 | 11/1998 |
| WO | WO 02/35555 A1 | 5/2002 |

OTHER PUBLICATIONS

Written Opinion of the International Searching Authority dated Nov. 2, 2004.
International Search Report dated Oct. 14, 2003.

* cited by examiner

*Primary Examiner* — Christopher Rodee
*Assistant Examiner* — Rachel Zhang
(74) *Attorney, Agent, or Firm* — Dickstein Shapiro LLP

(57) ABSTRACT

A process for producing resin-coated metal particles includes coating surfaces of metal particles with silica; allowing a polymerizable group to adsorb onto the surfaces of the silica-coated particles by the use of a silane coupling agent; and coating the surfaces of the silica-coated particles with a polymeric resin by mixing the particles to which the polymerizable groups have been adsorbed, a polymerizable monomer, a polymerization initiator, and a dispersant to polymerize the polymerizable monomer and the polymerizable groups.

19 Claims, 1 Drawing Sheet

PROCESS FOR PRODUCING RESIN-COATED METAL PARTICLES, RESIN-COATED METAL PARTICLES, AND TONER FOR FORMING CIRCUIT

TECHNICAL FIELD

The present invention relates to a process for producing resin-coated metal particles, resin-coated metal particles, and toner for forming a circuit. In particular, the present invention also relates to a process for producing resin-coated metal particles, the process being suitably employed in forming a circuit pattern including an electrical circuit, an electrode, or the like by electrophotographic technology. The present invention also relates to resin-coated metal particles and toner for forming a circuit.

BACKGROUND ART

For example, toner which is used for forming a circuit and which contains a conductive material coated with an insulating synthetic resin has been used in forming a circuit pattern on a substrate by electrophotography.

Specifically, for example, Patent Document 1 proposes a process for producing powdery toner, the process including preparing an aqueous dispersion (I) by emulsifying a mixture of a conductive material and a water-insoluble resin in the presence of a neutralizer, the water-insoluble resin being self-water dispersible after neutralization; preparing an aqueous dispersion (II) by subjecting an acid-group-containing resin to phase-inversion emulsification in the presence of a basic neutralizer, the acid-group-containing resin being self-water dispersible or water-soluble after neutralization; adding an acid to a homogeneous mixed solution of the aqueous dispersion (I) and the aqueous dispersion (II) to attach or deposit the acid-group-containing resin to surfaces of the resin particles coated with the conductive material; and fixing the resin to the surfaces.

Patent Document 2 proposes metallic toner for forming a conductive pattern, the toner being produced by a process of attaching a polymerization catalyst (Ziegler-Natta catalyst) to the surface of a conductive metallic material; bringing a gaseous monomer such as ethylene into contact with the catalyst attached to the surface of the metal particles to polymerize the monomer, i.e., polymerizing the monomer by direct polymerization, and to form insulating resin layers on the surfaces of the metal particles; and providing an electrification characteristic-imparting layer composed of an electrification material around or inside the insulating resin layer.

Patent Document 1: Japanese Unexamined Patent Application Publication No. 2001-154397
Patent Document 2: Japanese Patent No. 3232280

DISCLOSURE OF INVENTION

Problems to be Solved by the Invention

However, with respect to the powdery toner for forming a circuit described in Patent Document 1, it is necessary to control the pH of the aqueous dispersion (I), the aqueous dispersion (II), and the mixed solution thereof in the step of coating the conductive material with the resin. Furthermore, the surface properties (e.g. composition) of the conductive material to be coated significantly affect the condition of the resin coating. Thus, slight changes in pH or surface properties cause insufficient coverage, thereby leading to the complexity of the manufacturing procedure of the powdery toner. The incorporation of water into the interface between the metal and the resin may occur because the condition of the resin coating significantly varies depending on the condition of the metal surface. Furthermore, in the case of an insufficient resin coating, when the powdery toner is used for forming a circuit, the resin is disadvantageously detached from the surface of the conductive material because of friction and collisions between the powdery toner particles.

In the metallic toner for forming a conductive pattern described in Patent Document 2, the gaseous monomer is added while the metal particles provided with the polymerization catalyst are dispersed in a gas phase to allow the polymerization to proceed on the surfaces of the particles, thereby forming an insulating layer. Therefore, the monomer used must meet two requirements described below:

(1) the monomer is a gas or is easily converted into a gas, and
(2) the monomer is polymerized with a Ziegler-Natta catalyst.

The metal particles are agitated in a gas phase. Thus, the metal particles easily aggregate during the formation of the resin layer. Furthermore, Ziegler-Natta catalysts are inactivated by oxygen, water, and the like. Thus, a reaction system is required to be highly controlled. Moreover, since a flammable gaseous monomer is handled, large-scale facilities are required.

The present invention is accomplished to overcome the above-described problems. It is an object of the present invention to provide a process for producing resin-coated metal particles, the metal particles having excellent adhesion to the resin coating, the resin coating being hardly detached from the metal particles, and the process being easily capable of controlling a reaction system without using large-scale facilities and complicated reaction system when the metal particles serving as a conductive material are coated with the resin. It is another object of the present invention to provide resin-coated metal particles. Furthermore, it is another object of the present invention to provide toner for forming a circuit, the toner using the inventive resin-coated metal particles and being capable of forming an excellent circuit pattern with a low fog level.

Means for Solving the Problems

According to a first aspect of the present invention, a process for producing resin-coated metal particles includes the steps of coating surfaces of metal particles with silica; allowing a polymerizable group to adsorb onto the surfaces of the silica-coated metal particles by the use of a silane coupling agent; and coating the surfaces of the silica-coated metal particles with a polymeric resin by mixing the metal particles to which the polymerizable groups adsorb, a polymerizable monomer, a polymerization initiator, and a dispersant to polymerize the polymerizable monomer and the polymerizable groups.

According to a second aspect of the present invention, the process for producing the resin-coated metal particles according to the first aspect further includes a step of melting the polymeric resin at a temperature higher than the melting point of the polymeric resin and then rapidly cooling the polymeric resin.

According to a third aspect of the present invention, in the process for producing the resin-coated metal particles according to the first or second aspect, the resin-coated metal particles are toner for forming a circuit.

According to a fourth aspect of the present invention, in the process for producing the resin-coated metal particles according to any one of the first to third aspects, the metal particles are composed of one metal selected from copper, silver, nickel, and silver-palladium.

According to a fifth aspect of the present invention, a resin-coated metal particle includes a core formed of a metal particle; a silica layer covering the surface of the core; and a resin layer covering the silica layer.

According to a sixth aspect of the present invention, in the resin-coated metal particle according to the fifth aspect, the resin-coated metal particle includes one metal selected from copper, silver, nickel, and silver-palladium.

According to a seventh aspect of the present invention, in the resin-coated metal particle according to the fifth or sixth aspect, the surface of the particle is subjected to oxidation.

According to an eighth aspect of the present invention, a toner for forming a circuit includes a resin-coated metal particle according to any one of the fifth to seventh aspects.

In the step of coating the surfaces of the metal particles with silica, a silica coating agent prepared by hydrolyzing an alkoxide compound for forming silica is mixed with metal particles in a solvent, and the solvent is removed. Thereby, the surfaces of the metal particles are coated with silica to form silica layers on the surfaces of the metal particles. As the metal particles, a conductive metal, such as copper, silver, nickel, or a silver-palladium alloy, for forming a circuit pattern may be used. The average particle size of the metal particles is not particularly limited as long as the metal particles have an average particle size such that a circuit pattern is formed. For example, the average particle size is preferably in the range of 0.5 to 20 μm. The surfaces of the metal particles may be subjected to oxidation. Examples of the silica coating agent preferably used include alkoxide compounds, such as methoxysilane and tetraethoxysilane, for forming silica. In addition, the thickness of the silica layer is preferably 20 to 30 μm.

Silica covering the metal particles after the above-described step facilitates the adsorption of a silane coupling agent onto the surfaces of the metal particles, thus improving the rate of adsorption of polymerizable groups. Furthermore, by forming the silica layers on the surfaces of the metal particles, the effect of suppressing the sintering of the metal particles and the effect of improving bonding between the metal particles and a ceramic substrate can be expected.

In the step of allowing the polymerizable groups to adsorb onto the surfaces of the silica-coated metal particles with the silane coupling agent, the polymerizable groups (functional groups), which are polymerized with the polymerizable monomer, are attached to the silica layers on the surfaces of the metal particles. Therefore, in the following polymerization step, even when the amount of the polymerizable monomer is small, the polymerizable monomer is efficiently reacted with the polymerizable groups. As a result, the surfaces of the metal particles can be effectively coated with the polymeric resin without exposure of the metal particles at the surfaces of the toner.

The silane coupling agent is not particularly limited. For example, a silane coupling agent having a methacryl group or a mercapto group as a polymerizable group may be used. Furthermore, a silane coupling agent having a vinyl group as a polymerizable group, e.g. vinyltrimethoxysilane, vinyldimethoxysilane, or vinyldiethoxysilane, may also be used.

In the step of coating the surfaces of the silica-coated metal particles with a polymeric resin, the metal particles on which the polymerizable groups adsorb, the polymerizable monomer, the polymerization initiator, and the dispersant are mixed in the solvent to polymerize the polymerizable groups and the polymerizable monomer. Thereby, the surfaces of the silica-coated metal particles can be coated with the polymeric resin. As a result, the metal particles are chemically bonded to the polymeric resin with the silica layers, thus increasing adhesion between the metal particles and the coating resin. Therefore, the resin is difficult to be detached while friction electrification is caused by the flow of the particles; hence, satisfactory resin-coated metal particles can be produced.

The polymerizable monomer is not particularly limited as long as the polymerizable monomer is copolymerized with the polymerizable group of the silane coupling agent in the presence of the polymerization initiator by radical polymerization or the like. Examples of the polymerizable monomer usable include styrenes, such as styrene and α-styrene; monoolefins, such as ethylene and propylene; and acrylic esters, such as ethyl acrylate and n-butyl acrylate. The polymerization initiator is not particularly limited as long as the polymerization initiator is used in radical polymerization. Examples of the dispersant usable include polymeric dispersant, such as hydroxypropylcellulose, poly(vinyl alcohol), and hydroxyethylcellulose.

In the step of melting the polymeric resin at a temperature higher than the melting point of the polymeric resin and then rapidly cooling the polymeric resin, by melting the polymeric resin at a temperature higher than the melting point of the polymeric resin, the polymeric resin on the surface of each metal particle is formed into a sphere due to the surface tension of the molten resin. Then, the molten resin is rapidly cooled into a solid while the spherical polymeric resin is maintained. Thereby, the flowability of the resin-coated metal particles is improved, thus facilitating frictional electrification. Furthermore, in this step, the smoothness of the surfaces of the resin-coated metal particles can reduce the exposed portion of the metal particles.

Each of the resin-coated metal particles of the present invention includes a core formed of metal particle; a silica layer covering the surface of the core; and a resin layer covering the silica layer. The resin-coated metal particles can be used as, for example, toner for forming a circuit. Even if the metal particle is incompletely coated with the resin layer, insulation at a defective portion is maintained by the silica layer. Therefore, a satisfactory image can be produced when a circuit is formed. In addition, the surfaces of the metal particles are preferably subjected to oxidation. This oxidation provides the formation of oxide films on the surfaces of the metal particles. Combined with the silica layers, the oxide films further improve the electrification characteristics of the metal particles.

A toner of the present invention for forming a circuit includes the above-described resin-coated metal particles of the present invention and is used as an electrophotographic developer in forming a circuit. The toner for forming a circuit as an electrophotographic developer is applied on a ceramic green sheet by printing with a dry two-component electrophotographic printer, thus resulting in a fine-resolution circuit pattern having a low fog level. Furthermore, when a circuit pattern is formed on a ceramic substrate with the inventive toner for forming a circuit and is then fired, the silica layers can suppress the sintering of the metal particles and can suppress the breakage caused by the granulation of the metal due to the difference in the sintering temperatures of the metal and the ceramics.

Advantage

According to first to seventh aspects of the present invention, the present invention provides a process for producing resin-coated metal particles, the metal particles having excellent adhesion to the resin coating, the resin coating being hardly detached from the metal particles, and the process being easily capable of controlling the reaction system without using large-scale facilities and a complicated reaction system when the metal particles serving as a conductive material are coated with the resin. Furthermore, the present invention also provides resin-coated metal particles. According to an eighth aspect of the present invention, provided is a toner for forming a circuit, the toner using the inventive resin-coated metal particles and being capable of forming an excellent circuit pattern with a low fog level.

Figure 1:
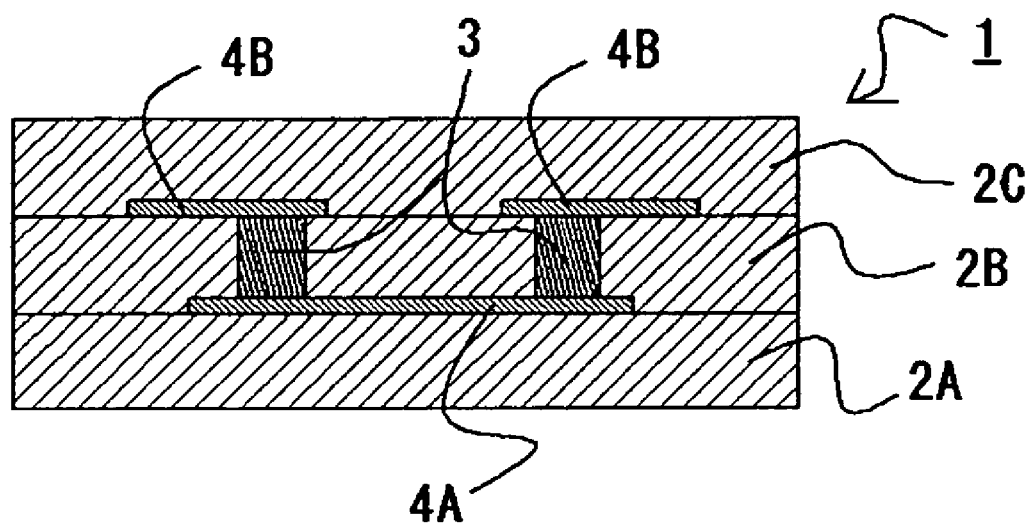
FIG. 1 is a fragmentary cross-sectional view of an example of a multilayer circuit board produced with inventive toner for forming a circuit.

| Reference Numerals | |
|---|---|
| 1 | multilayer circuit board |
| 2A, 2B, 2C | ceramic layer |
| 3 | via-hole conductor |
| 4A, 4B | circuit pattern |

BEST MODE FOR CARRYING OUT THE INVENTION

A process for producing metal particles coated with a resin, metal particles coated with a resin, and toner for forming a circuit, of the present invention will be described below on the basis of Examples.

EXAMPLES

Example 1

(1) Manufacture of Metal Particles Coated with Silica

First, 55 g of copper particles having oxidized surfaces (average particle size: 5.5 μm, manufactured by Dowa Mining Co., Ltd.) was mixed with 7.3 g of a silica coating agent prepared from a silicon alkoxide (ES-01, manufactured by Fuji Chemical Co., Ltd.; the silicon alkoxide was referred to as "silica coating agent" in Table 1) in 12 g of ethanol. Then, the solvent was removed under reduced pressure. Subsequently, the resulting mixture was left standing at a temperature of 85° C. and a humidity of 85% in an oven for 1 hour or more to coat the surfaces of the copper particles with silica (samples 1 to 4). The surfaces of the copper particles do not necessarily need to be subjected to oxidation. After coating the copper particles with silica, humidification may be further performed in order to facilitate hydrolysis of the silica coating agent.

(2) Adsorption of Polymerizable Group to Copper Particles Coated with Silica

In an ethanol solution, 10 g of the copper particles coated with silica and 0.5 g of 3-methacryloxypropyltrimethoxysilane functioning as a silane coupling agent were refluxed for 1 hour, resulting in adsorption of polymerizable groups (methacryl groups) on the surfaces of the copper particles coated with silica (samples 1 to 3 and 5 and 6). In sample 4, a mercaptosilane coupling agent (mercapto group serves as a polymerizable group) was used in place of 3-methacryloxypropyltrimethoxysilane.

In this Example, the methacrylsilane coupling agent and the mercaptosilane coupling agent were used as the silane coupling agents used for allowing polymerizable groups in the agents to adsorb on the surfaces of the copper particles coated with silica. Another silane coupling agent, such as vinyltrimethoxysilane, vinyldimethoxysilane, or vinyldiethoxysilane, may be used in addition to those compounds.

(3) Adsorption of Polymeric Resin to Copper Particles to Which Polymerizable Group Adsorb First, 10 g of the copper particles to which the polymerizable groups adsorb (samples 1 to 6) and 4 g of hydroxypropylcellulose serving as a dispersant were dispersed in 100 g of ethanol to form an ethanol mixed solution.

The ethanol mixed solution was heated to 60° C. under a nitrogen atmosphere and stirred for 30 minutes. Then, 20 g of styrene, which is a polymerizable monomer, and 0.5 g of a polymerization initiator (ABN-v, manufactured by Japan Hydrazine Company, Inc.) were added to the ethanol mixed solution, and the polymerization reaction was continued for 6 hours. As a result, styrene and the polymerizable groups (methacryl groups) adsorbed on the surfaces of the copper particles coated with silica were polymerized. Thereby, the surfaces of the copper particles coated with silica were covered with the resin by the use of the methacryl groups. After the reaction was continued for 6 hours, the ethanol mixed solution was gradually added dropwise to 100 mL of ethanol to terminate the polymerization in the ethanol mixed solution.

In the adsorption of the resin on the surfaces of the copper particles coated with silica, a polymeric dispersant, such as poly(vinyl alcohol) or hydroxyethylcellulose, may be used other than hydroxypropylcellulose used in this Example.

In the present invention, a polymerizable monomer that can be polymerized by radical polymerization to form a resin may be used. Examples of such a monomer include monoolefins such as ethylene and propylene; styrenes such as α-styrene; and acrylic esters such as ethyl acrylate.

The ethanol mixed solution was left standing. After a supernatant liquid was discarded, a washing operation of adding 100 mL of fresh ethanol and then stirring the resulting mixture was performed 3 or 4 times to produce a target copper particles coated with the resin. In this Example, ethanol was used as the solvent. However, another solvent, such as methanol, isopropanol, hexane, toluene, water, or a mixed solvent thereof, may be used. A solvent that dissolves a polymerizable monomer but does not dissolve a polymeric resin is preferably used as in this Example. In the washing operation, a compound identical to the solvent was preferably used as the washing solution as in this Example.

(4) Evaluation of Condition of Resin Coating of Copper Particles Coated with Resin The evaluation of the condition of the resin coating of the copper particles was performed on the basis of etching resistance and printing characteristics.

a) Evaluation of Etching Resistance

Etching resistance was evaluated as follows: The copper particles coated with the resin were immersed in an etching solution (aqueous solution of 10% ammonium persulfate) for 24 hours. Then, non-etched copper particles coated with the resin were recovered with a centrifuge. The etching resistance was evaluated according to whether the copper particles coated with the resin were recovered or not. Table 1 shows the results. When the condition of the resin coating of the copper particles coated with the resin is good, the copper particles were not etched. That is, the copper particles do not dissolve and remain. When the condition of the resin coating is poor, the copper particles dissolve. Therefore, the etching resistance is evaluated according to the evaluation criteria described below:

Good: Non-etched copper particles coated with the resin could be recovered.

Poor: None of non-etched copper particles coated with the resin was recovered.

In Table 1, a sample marked with an asterisk (*) is outside the range of the present invention, the rest of the samples are within the range of the present invention.
b) Evaluation of Printing Characteristics First, 5 g of a hydrophobic fine silica powder (R812, primary particle size: 7 nm, manufactured by Nippon Aerosil Co., Ltd.) as an external additive was mixed with 1 kg of the resin-coated copper particles with a dry mixer (Henschel mixer) to prepare toner for forming a circuit, and then 20 g of the toner for forming a circuit was mixed with 80 g of an electrophotographic carrier to prepare a photographic developer for forming a circuit. In this Example, a ferrite carrier in which particles of the ferrite carrier were coated with a silicone resin was used as the electrophotographic carrier, the particles each having an average particle size of 60 μm. Known electrophotographic carriers disclosed in, for example, Patent Document 1 may also be used as the electrophotographic carrier other than that used in this Example. In mixing the external additive, when the amount of the resulting mixture was small, a sample mill, IKA mill, or the like may be used.

The photographic developer for forming a circuit was applied to paper by electrophotography. The copper particles coated with the resin were evaluated for printing characteristics. Table 1 shows the results. The printing characteristics were evaluated according to the evaluation criteria described below:

Good: The powdery toner was not scattered to the non-printed area.

Poor: The powdery toner was scattered to the non-printed area.

The reason for the scattering of the powdery toner is described as follows: In the case of the copper particles not coated with the resin, the charge generated by frictional electrification dissipates from the copper particles. Thus, the copper particles do not adsorb on a charged photoreceptor but were scattered inside a printer.

Thus, even if the polymeric resin coating is incomplete, insulation at a defective portion is easily maintained. Therefore, when the samples are used as a toner for forming a circuit, the charge is difficult to dissipate.

In contrast, samples 5 and 6, which were out of the range of the present invention, each prepared by performing direct adsorption of the polymerizable groups to the copper particles were poor in both etching resistance and printing characteristics. This indicated that the surfaces of the copper particles were not entirely coated with the polymeric resin.

Example 2

In this Example, observations on the adsorbed state of the polymerizable group and the condition of the resin coating were made.

(1) Manufacture of Copper Particles Coated with Silica

Copper particles were coated with silica as in Example 1.

(2) Adsorption of Polymerizable Group to Copper Particles Coated with Silica and Evaluation of Adsorbed State An ethanol solution containing 10 g of the above-described copper particles and 0.5 g of a silane coupling agent (KBM-503, manufactured by Shin-Etsu Chemical Co., Ltd.) was refluxed to allow polymerizable groups (methacryl groups) to adsorb onto the surfaces of the copper particles coated with silica. The copper particles on which the polymerizable groups (methacryl groups) were adsorbed were subjected to thermal analysis, i.e., the particles were heated from 30° C. to 500° C. at a heating rate of 10° C./min. As a result, a reduction in weight resulting from the methacryl group was determined to be 0.7 percent by weight.

(3) Adsorption of Polymeric Resin to Copper Particles on Which Polymerizable Groups are Adsorbed and Evaluation of State of Resin Coating In this Example, an aqueous ethanol solution (ethanol/water=80/20) was used as the solvent in place of ethanol. Resin-coated copper particles were prepared as in Example 1

TABLE 1

| Sample | Oxidation | Silica coating agent | Humidification | Polymerizable group | Etching resistance | Printing characteristics |
| --- | --- | --- | --- | --- | --- | --- |
| 1 | Done | Methoxysilane | Done | Methacryl group | Good | Good |
| 2 | Not done | TEOS-aqueous ammonia mixed solution | Done | Methacryl group | Good | Good |
| 3 | Done | Methoxysilane | Not done | Methacryl group | Good | Good |
| 4 | Done | Methoxysilane | Not done | Mercapto group | Good | Good |
| * 5 | Not done | Nonuse | Not done | Methacryl group | Poor | Poor |
| * 6 | Not done | Nonuse | Not done | Methacryl group | poor | poor |

From the results shown in Table 1, samples 1 to 4 each prepared by coating the copper particles with silica, allowing the polymerizable groups to adsorb onto the surfaces of the copper particles coated with silica, and covering the copper particles with the resin by the use of the polymerizable groups were good in etching resistance and printing characteristics. Consequently, it was found that by coating the copper particles with silica and then covering the surfaces of the silica-coated copper particles with the polymeric resin, the polymeric resin coating is hardly detached from the copper particles.

Furthermore, in samples 1 to 4, the surfaces of the copper particles were oxidized and then coated with silica layers.

except that 10 g of styrene was added as the polymerizable monomer. That is, the resin-coated copper particles were prepared by covering the surfaces of the silica-coated copper particles with the resin by the use of the polymerizable groups. The resulting resin-coated copper particles were subjected to thermal analysis, i.e., the particles were heated from 30° C. to 500° C. at a heating rate of 10° C./min. As a result, the reduction in weight resulting from the methacryl groups and the resin was determined to be 5.2 percent by weight. Of the reduction in weight of 5.2 percent by weight, the reduction in weight resulting from the methacryl groups (polymerizable groups) was 0.7 percent by weight. Therefore, the reduction in weight resulting from the resin was 4.5 percent by weight.

The resin-coated copper particles were subjected to differential thermal analysis with a differential scanning calorimeter (measurement conditions: 10° C./min, −50° C. to +150° C.). As a result, a glass transition temperature of 100° C. attributable to styrene (polymerizable monomer) was observed. In addition, the resin-coated copper particles were observed with a scanning electron microscope (SEM). As a result, it was found that no aggregation of the resin-coated copper particles was observed, and capsules coated with the resin were produced.

Comparative Example 1

In this Comparative Example, a sample was prepared as in Example 2 except that silica was coated onto the surfaces of the copper particles. The resulting sample was subjected to thermal analysis under the same conditions as those in Example 2. As a result, it was found that a reduction in the weight of the sample was not observed, and no resin was attached to the copper particles. The results indicated that adsorption treatment for allowing the polymerizable groups to adsorb directly onto the surfaces of the copper particles with a silane coupling agent resulted in no adsorption of the polymerizable groups to the copper particles, and subsequent resin-coating treatment resulted in no attachment of the polymeric resin to the surfaces of the copper particles.

Comparative Example 2

In this Comparative Example, a sample was prepared as in Example 2 except that adsorption treatment for allowing the polymerizable groups to adsorb by the use of a silane coupling agent was not performed. The resulting sample was subjected to thermal analysis under the same conditions as those in Example 2. As a result, it was found that a reduction in the weight of the sample was not observed, and no resin was attached to the copper particles. The results indicated that when the surfaces of the copper particles were coated with the silica layers and then the silica layers were directly subjected to resin coating treatment, no polymeric resin was attached to the surfaces of the copper particles.

From the results of Example 2 and Comparative Examples 1 and 2, it was found that the surfaces of the copper particles can be surely and firmly coated with the polymeric resin by performing silica-layer-coating treatment and adsorption treatment for allowing polymerizable groups to adsorb.

Example 3

In this Example, the resin-coated copper particles prepared in Example 2 were subjected to heat treatment at 355° C. and a volume of hot air of 1,000 L/min with a Surfusion system (manufactured by Nippon Pneumatic Mfg. Co., Ltd.) to melt the coating resin, and then the coating resin was rapidly cooled into a solid to prepare heat-treated resin-coated copper particles.

Observation on the heat-treated copper particles coated with the resin with a SEM indicated that the coating resin of the heat-treated resin-coated copper particles had smooth surfaces, and spherical capsules uniformly coated with the coating resin were produced. The spherical resin coating of the resin-coated copper particles improves the flowability of the resin-coated copper particles, thus facilitating frictional electrification. Furthermore, the smoothness of the surfaces of the resin-coated copper particles can reduce the exposed portion of the copper particles.

Example 4

In this Example, the resin-coated copper particles of the present invention were used as toner for forming a circuit. A multilayer circuit board including a circuit pattern was produced by electrophotography with an electrophotographic printer or the like. Electric characteristics (in this Example, continuity) of the circuit pattern were evaluated. Satisfactory charging characteristics of the toner for forming a circuit result in an image having a low fog phenomenon. (This is the state in which toner is scattered on the background. Many fogs impair line linearity, thereby degrading high-frequency characteristics and reliability).
(1) Formation of Circuit Pattern In the same way as in Example 1, 5 g of a hydrophobic fine silica powder as an external additive was mixed with 1 kg of the resin-coated copper particles prepared in Example 2 to prepare toner for forming a circuit, and then 20 g of the toner for forming a circuit was mixed with 80 g of an electrophotographic carrier to prepare a photographic developer (1) for forming a circuit.

In the same way as for the photographic developer (1) for forming a circuit, the heat-treated resin-coated copper particles prepared in Example 3 were mixed with the external additive and the electrophotographic carrier to prepare a photographic developer (2) for forming a circuit.

These photographic developers (1) and (2) for forming circuits were applied to ceramic green sheets by printing with a dry two-component electrophotographic printer to form circuit patterns.

Both the resulting images formed of the photographic developers (1) and (2) for forming circuits were good images with low fog levels. To be precise, the photographic developer (2) containing the heat-treated particles for forming a circuit provided a good image with a lower fog level compared with the image formed of the photographic developer (1) containing the unheated particles. Consequently, it was found that heat treatment the resin-coated copper particles improved flowability of the particles, thereby providing an image with a lower fog level compared with the case of the unheated particles.
(2) Evaluation of Circuit Pattern for Continuity The resulting ceramic green sheets having circuit patterns formed of the photographic developers (1) and (2) for forming circuits were dewaxed and fired by a known technique to form ceramic sheets having the circuit patterns. The electrical resistances of the resulting circuit patterns were measured. As a result, there was continuity in any one of the circuit patterns.
(3) Manufacture of Multilayer Circuit Board Ba—Al—Si—O-based ceramic green sheets were formed. In a predetermined ceramic green sheet, via holes were formed according to a predetermined pattern, and then a conductor material was injected into the via holes by a known process to form via-hole conductors. Subsequently, circuit patterns were formed on predetermined ceramic green sheets by electrophotography described above with the photographic developers (1) and (2) for forming circuits. Then, lamination, dewaxing, and firing were performed to produce, for example, a multilayer circuit board 1 shown in FIG. 1.

As shown in FIG. 1, the multilayer circuit board 1 includes a plurality of ceramic layers 2A, 2B, and 2C; a plurality of via-hole conductors 3 formed in the intermediate ceramic layer 2B; and circuit patterns 4A and 4B, the circuit pattern 4A being provided along the interface between the ceramic layers 2A and 2B, the circuit pattern 4B being provided along the interface between the ceramic layers 2B and 2C, and the circuit patterns 4A and 4B being electrically connected through the via-hole conductors 3, wherein the circuit patterns 4A and 4B are composed of the photographic developer of this Example.

In this Example, the resin-coated copper particles prepared in Example 2 or the heat-treated resin-coated copper particles prepared in Example 3 were used, thus suppressing sintering of the copper particles during firing. Furthermore, the silica coating on the surfaces of the copper particles can prevent the breakage caused by the granulation of the copper particles due to the difference in the sintering temperatures of the copper particles and the ceramic layers 2A, 2B, and 2C.

Comparative Example 3

In this Comparative Example, the copper particles used in Example 2 and a polyester resin were melted by heating and kneaded with a kneader. The resulting mixture was cooled into a solid. Then, the cooled mixture was pulverized with a cutter mill and a jet mill. A fine powder was removed from the pulverized mixture with a classifier, thereby resulting in electrifiable particles having an average particle size of 6 µm. Subsequently, an external additive and an electrophotographic carrier were added to the electrifiable particles. The same process as that in Example 4 was performed to prepare a photographic developer (3) for forming a circuit. The resulting developer (3) was applied on a ceramic green sheet by printing in the same way as in Example 4, and then printing characteristics were evaluated. As a result, it was found that the image (circuit pattern) formed of the photographic developer (3) for forming a circuit of this Comparative Example had a high fog level. Furthermore, it was also found that the amount of toner applied was small, and thus a blurred image was formed.

The ceramic green sheet containing the circuit pattern of this Comparative Example was dewaxed and fired as in Example 4. Then, the electrical resistance of the circuit pattern on the ceramic sheet was measured. As a result, there was no continuity in the fired circuit pattern.

The present invention is not limited to the Examples described above. The present invention includes various modifications without departing from the spirit of the present invention. For example, the copper particles are exemplified as the metal particles in Examples described above. Other conductive metal particles such as silver particles or nickel particles, which are used for forming a circuit, may be used. In addition, an alkoxide compound for forming silica is exemplified in Examples described above. A metal alkoxide for forming a compound other than silica may be used depending on the application of the resin-coated metal particles.

INDUSTRIAL APPLICABILITY

The present invention can be suitably applied to, for example, toner for forming a circuit used in producing an electronic component having a circuit pattern.

The invention claimed is:

1. A process for producing resin-coated metal particles comprising: providing metal particles with surfaces coated with silica; combining the silica-coated metal particles with a polymerizable group-containing silane coupling agent so as to absorb the polymerizable group onto the surfaces of the particles; and forming a polymeric resin coating on the surfaces of the silica-coated metal particles by polymerizing a composition comprising a polymerizable monomer in the presence of the polymerizable group-containing particles.

2. The process for producing the resin-coated metal particles according to claim 1, the process further comprising heating the polymeric resin on the particles at a temperature higher than the melting point of the polymeric resin and then cooling the polymeric resin so as to form a spherical product.

3. A resin-coated metal particle comprising: a metal core having a surface; a silica layer covering the surface of the core; and a resin layer covering the silica layer.

4. The resin-coated metal particle according to claim 3, wherein the particle metal is selected from the group consisting of copper, silver, nickel, and silver-palladium.

5. The resin-coated metal particle according to claim 4, wherein the surface of the metal core is an oxidized surface.

6. The resin-coated metal particle according to claim 5 in combination with an electrophotographic carrier.

7. The resin-coated metal particle according to claim 3, wherein the surface of the metal core is an oxidized surface.

8. The resin-coated metal particle according to claim 4 in combination with an electrophotographic carrier.

9. The resin-coated metal particle according to claim 3 in combination with an electrophotographic carrier.

10. The resin-coated metal particles according to claim 3, wherein the particles have a particle size of 0.5 to 20 µm.

11. The resin-coated metal particle according to claim 10 in combination with an electrophotographic carrier.

12. The resin-coated metal particles according to claim 3, wherein the surface of the resin is spherical.

13. The resin-coated metal particle according to claim 12 in combination with an electrophotographic carrier.

14. A process for producing a toner for forming a circuit which comprises combining the resin-coated metal particles according to claim 3 with an electrophotographic carrier.

15. The process for producing a toner according to claim 14, wherein the metal of the particles are copper.

16. The process for producing a toner according to claim 14, wherein the particles are spherical.

17. The process for producing the resin-coated metal particles according to claim 1, wherein the particle metal is selected from the group consisting of copper, silver, nickel, and silver-palladium.

18. The process for producing the resin-coated metal particles according to claim 1, wherein the composition comprising a polymerizable monomer, a polymerization initiator, and a dispersant, and wherein the process further comprises coating the surface of the metal particles with silica.

19. The process for producing the resin-coated metal particles according to claim 1, further comprising oxidizing the surface of the metal particles before coating them with silica.

* * * * *